US009113244B2

(12) United States Patent
Decanio

(10) Patent No.: US 9,113,244 B2
(45) Date of Patent: Aug. 18, 2015

(54) LOUDSPEAKER FOR ELIMINATING A FREQUENCY RESPONSE DIP

(71) Applicant: Harman International Industries, Inc., Stamford, CT (US)

(72) Inventor: William Decanio, Castaic, CA (US)

(73) Assignee: Harman International Industries, Inc., Stamford, CT (US)

( * ) Notice: Subject to any disclaimer, the term of this patent is extended or adjusted under 35 U.S.C. 154(b) by 32 days.

(21) Appl. No.: 13/891,495

(22) Filed: May 10, 2013

(65) Prior Publication Data

US 2014/0334659 A1 Nov. 13, 2014

(51) Int. Cl.

| | |
|---|---|
| ***H04R 1/02*** | (2006.01) |
| ***H04R 1/20*** | (2006.01) |
| ***H05K 5/00*** | (2006.01) |
| ***H04R 1/28*** | (2006.01) |
| *H04R 1/34* | (2006.01) |

(52) U.S. Cl.

CPC .............. *H04R 1/025* (2013.01); *H04R 1/2803* (2013.01); *H04R 1/345* (2013.01)

(58) Field of Classification Search

CPC ............ H04R 1/02; H04R 1/021; H04R 1/20; H04R 1/345

USPC ........... 381/87, 345, 349–350, 353, 386, 395; 181/148, 198–199, 144, 156

See application file for complete search history.

(56) References Cited

U.S. PATENT DOCUMENTS

| | | | | |
|---|---|---|---|---|
| 3,326,321 | A | 6/1967 | Valuch | |
| 6,625,289 | B1 * | 9/2003 | Oliemuller | 381/182 |
| 2009/0065293 | A1 * | 3/2009 | Moore | 181/192 |
| 2010/0266149 | A1 | 10/2010 | Prenta et al. | |

FOREIGN PATENT DOCUMENTS

| | | | |
|---|---|---|---|
| EP | 0909111 | A2 | 4/1999 |
| GB | 2459338 | A | 10/2009 |

OTHER PUBLICATIONS

Extended European Search Report for corresponding Application No. 14167565.2, mailed Sep. 28, 2014, 7 pages.

* cited by examiner

*Primary Examiner* — Curtis Kuntz
*Assistant Examiner* — Katherine Faley
(74) *Attorney, Agent, or Firm* — Brooks Kushman P.C.

(57) ABSTRACT

In at least one embodiment, a speaker system is provided. The speaker system includes a speaker enclosure having a front end, a rear end, and a first transducer. The front end is arranged to face a listening area. The rear end is arranged for being mounted to a mounting surface. The first transducer is positioned within the speaker enclosure for facing into the mounting surface such that the first loudspeaker transmits acoustic energy from the rear end towards the mounting surface to prevent a frequency response dip with the transmitted acoustic energy.

17 Claims, 5 Drawing Sheets

LOUDSPEAKER FOR ELIMINATING A FREQUENCY RESPONSE DIP

TECHNICAL FIELD

Embodiments disclosed herein generally relate to a loudspeaker that is capable of being mounted on a surface in such a way as to eliminate a characteristic frequency response dip due to interaction with the surface.

BACKGROUND

An in-wall sub-woofer with a high volume displacement is disclosed in U.S. Publication No. 2010/0266149 ("the '149 publication") to Prenta et al. The '149 publication discloses that the speaker system includes at least one pair of active transducers mounted in a wall section. The active transducers may be mounted in at least one enclosure. Each active transducer has a sound radiating surface. Each active transducer is also mounted substantially perpendicular to a surface of the wall section with the sound radiating surfaces substantially parallel to each other. The sound radiating surfaces may be facing each other or away from each other. The in-wall speaker system may also include one or more pairs of passive radiators to generate sound from sound pressure generated by the active transducers. The pairs of speakers in the wall section may be mounted vertically or horizontally within the wall, with a slot or a vent at the opening at the space between the speaker pairs.

SUMMARY

In at least one embodiment, a speaker system is provided. The speaker system includes a speaker enclosure having a front end, a rear end, and a first transducer. The front end is arranged to face a listening area. The rear end is arranged for mounting to a mounting surface. The first transducer is positioned within the speaker enclosure for facing into the mounting surface such that the first loudspeaker transmits acoustic energy from the rear end towards the mounting surface to prevent a frequency response dip with the transmitted acoustic energy.

In at least another embodiment, a speaker system is provided. The speaker system includes a speaker enclosure having a front end, a rear end, and a first transducer. The front end is arranged to face a listening area. The rear end is arranged for being mounted to a mounting surface. The first transducer is positioned within the speaker enclosure for directly facing into the mounting surface such that the first loudspeaker transmits acoustic energy from the rear end directly into the mounting surface to prevent a frequency response dip with the transmitted acoustic energy.

In at least another embodiment, a speaker system is provided. The speaker system includes a speaker enclosure having a front end, a rear end, and a first transducer. The front end is arranged to face a listening area. The rear end is arranged for being mounting to a mounting surface. The transducer is positioned within the speaker enclosure for directly transmitting acoustic energy from the rear end into the mounting surface to prevent a frequency response dip with the transmitted acoustic energy.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

DETAILED DESCRIPTION

As required, detailed embodiments are disclosed herein; however, it is to be understood that the disclosed embodiments are merely exemplary of the present disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the subject matter of the present disclosure.

Figure 1:
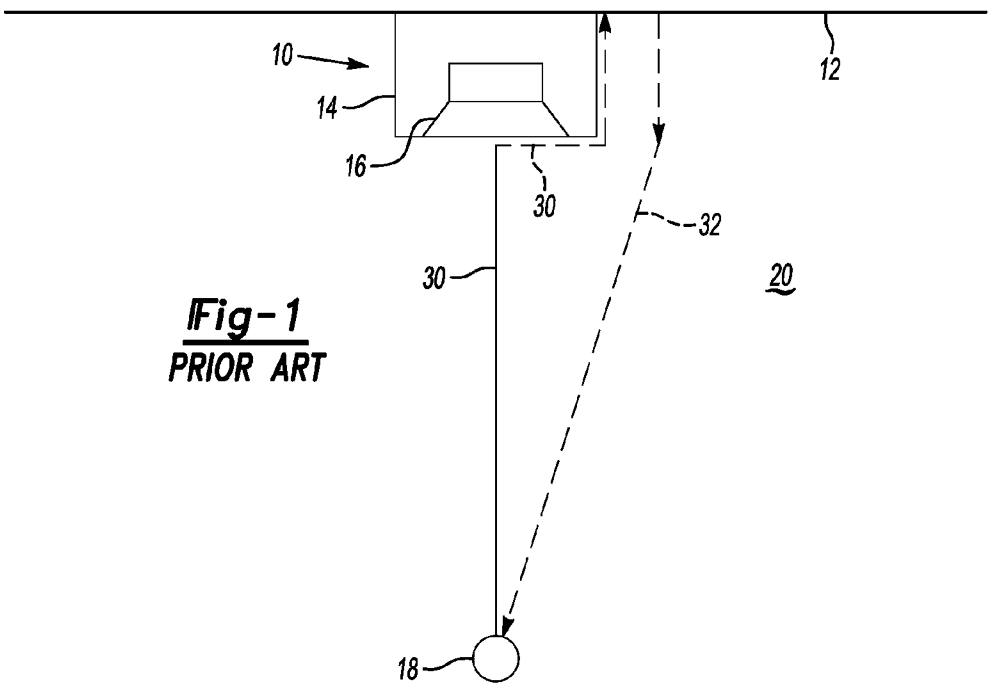
Fig-1 PRIOR ART
FIG. 1 depicts a conventional loudspeaker system mounted on a wall.

FIG. 1 depicts a conventional loudspeaker system 10 mounted on a wall 12. The system 10 includes an enclosure 14 and a speaker (or transducer) 16 that is positioned within the enclosure 14. The speaker 16 faces away (or opposite) from the wall 12 for transmitting acoustic energy 30 at a low frequency to a listening or observation point 18 in a room 20 (or listening area 18 in the room 20). While it is generally desirable for the transducer 16 to transmit the acoustic energy away from the wall 12, the loudspeaker system 10 exhibits omnidirectional acoustic radiation characteristics at low frequencies. As such, the acoustic energy 30 as transmitted from the speaker 16 interacts with the wall 12.

For example, at low frequencies, the acoustic energy 30 radiates around the transducer 16 and contacts the wall 12. Reflected acoustic energy 32 reflects off of the wall 12 and travels to the listening point 18. This condition illustrates that the reflected acoustic energy 32 travels a greater distance (or longer path) which causes a delayed arrival time of the reflected acoustic energy 32 relative to the acoustic energy 30 at the focal point 18. In this case, the arrival time of the reflected acoustic energy 32, which is delayed, may interfere with the acoustic energy 30 causing an interference dip in frequency as observed at the listening point 18.

At frequencies where a path length difference between the direct wave of the acoustic energy 30 (e.g., the acoustic energy as it propagates from the transducer 16 to the listening point 18) and the reflected acoustic energy 32 is equal to half a wavelength, a strong destructive interference dip occurs at the listening point 18. A typical frequency range for the dip is between 200 and 600 Hz for a surface (e.g., wall or ceiling) mounted speaker (e.g., vertical or horizontal mounted speaker). The frequency range for the dip generally depends on the enclosure 14 and the transducer 16 characteristics. In general, transducers 16 that operate in a frequency of between 20 Hz and 2 KHz may exhibit a frequency dip for the reasons noted above. As the frequency of the transducer 16 used in the system 10 increases, rear wall (or surface) reflection interferences becomes less of an issue because the directivity of the transducer 16 results in less acoustical energy that is reflected from the wall 12.

Figure 2:
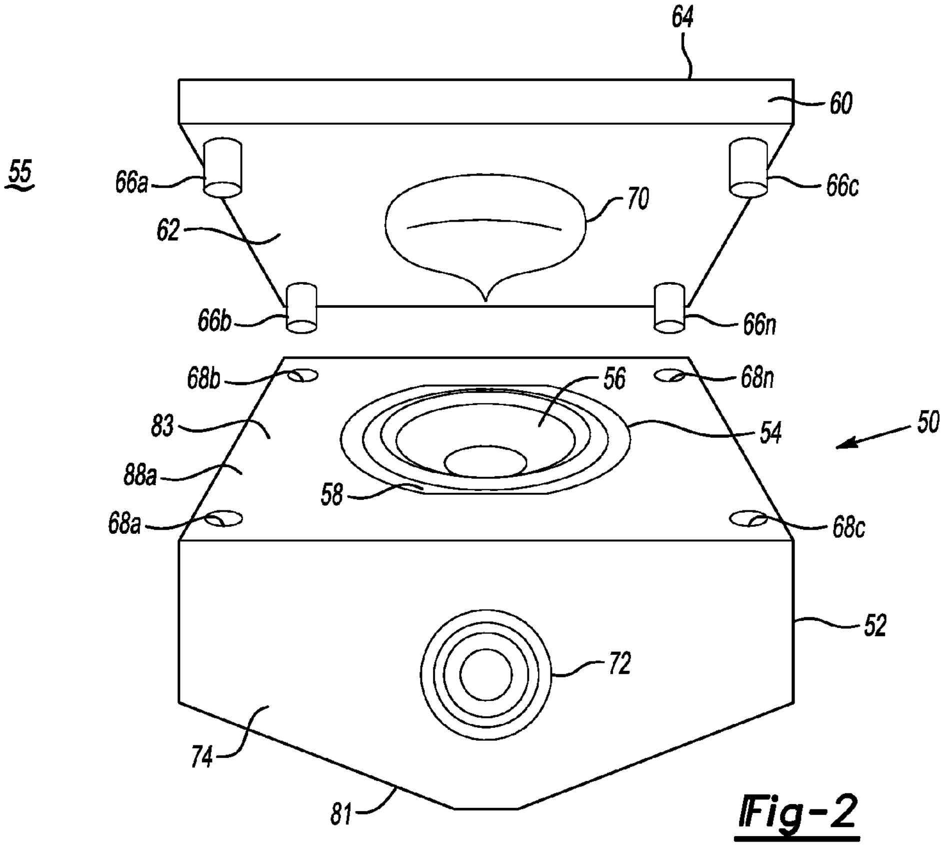
FIG. 2 depicts a loudspeaker system in accordance to one embodiment.

FIG. 2 depicts a loudspeaker system 50 in accordance to one embodiment. The loudspeaker system 50 includes a speaker enclosure 52 and a first speaker (or transducer) 54. The enclosure 52 forms a housing for supporting the first transducer 54 about a vertical or horizontal surface 55 (or "mounting surface"). The vertical surface may be, for example, a wall or door. The horizontal surface may be, for example, a floor or ceiling. In one example, the loudspeaker system 50 may be part of a surround sound system that is employed in a residential or commercial establishment.

In general, the first transducer 54 may transmit the acoustic energy at an operating frequency range of between 20 Hz and 20 KHz. In this case, the first transducer 54 may be arranged as a full range loudspeaker (e.g., for frequencies between 20 Hz and 200 KHz), a woofer (e.g., for frequencies between approximately 20 Hz and 250 Hz, or as a mid-range driver (e.g. for frequencies between approximately 250 Hz and 2 KHz). The first transducer 54 includes a diaphragm (or flexible cone) 56 and a surround (or suspension) 58. The diaphragm 56 is generally arranged to produce sound (or audible) waves by rapidly vibrating. The surround 58 allows the diaphragm to move and is attached to a driver (not shown).

A cover 60 may be optionally provided to interface with the enclosure 52 to mount to the surface 55. The cover 60 includes a first side 62 and a second side 64. The second side 64 is generally arranged to be mounted to the surface 55. By mounting the second side 64 to the surface 55, this condition illustrates that the first transducer 54 faces the first side 62 and consequentially the surface 55 (e.g., wall, floor or ceiling) as opposed to the first transducer 54 facing the listening area (or room) 20. In this case, a rear of the first transducer 54 (e.g., rear of the diaphragm 56 and rear of the surround 58) faces into the enclosure 52 and into the listening area 18.

By positioning the first transducer 54 to face the surface 55, the diaphragm 56 transmits the acoustic energy into the cover 60 and conversely into the surface 55. In this case, the first transducer 54 and the surface 55 become a nearly coincident source to locations within the listening area 18 thereby eliminating frequency dip as noted in connection with FIG. 1. In one example, the first transducer 54 may be positioned within 0.5 and 1.5 inches from the surface 55. A thickness of the cover 60 (and/or any gap formed between the cover 60 and the first transducer 54) may be arranged to be indicative of the desired distance between the first transducer 54 and the surface 55. In this case, the user may simply couple the cover 60 to surface 55 and subsequently couple the enclosure 52 to the cover 60 to ensure the distance between the first transducer 54 and the surface 55 is proper to mitigate the frequency response dip.

The cover 60 may include a first plurality of engagement devices 66*a*-66*n*. In one example, the first plurality of engagement devices 66*a*-66*n* may be arranged as male shaped pins. The enclosure 52 may include a second plurality of engagement devices 68*a*-68*n* for interfacing with the first plurality of engagement devices 66*a*-66*n* such that the cover 60 is secured to the enclosure 52 and the cover 60 supports the enclosure 52 to the vertical surface 55. In one example, the second plurality of engagement devices 68*a*-68*n* may be female shaped openings for receiving the male shaped pins of the cover 60. It is recognized that the first plurality of engagement device 66*a*-66*n* may be formed of female shaped openings and that the second plurality of engagement devices 68*a*-68*n* may be formed of male shaped pins.

A spreading device (or diffuser) 70 may be positioned on the second side 62 of the cover 60. The spreading device 70 may enhance the ability to mitigate frequency dip. The spreading device 70 may enhance the frequency response of the acoustic energy transmission by providing a graduated, smooth transition (in addition to a reduction of acoustic reflection) of acoustic energy from a front of the diaphragm 56 to around the enclosure 52.

It is recognized that the use of the cover 60 in the system 50 may be removed and the enclosure 52 may be directly coupled to the surface 55. In this case, the first plurality of engagement devices 66*a*-66*n* may be positioned on the surface 55 and may interface with corresponding second plurality of engagement device 68*a*-68*n* of the enclosure 52 such that the enclosure 52 is supported about the surface 55. A mount 72 may be coupled to a bottom side 74 of the enclosure 52 for supporting the enclosure 52 about the surface 55 without the use of the cover 60. For example, a stand (not shown) may be provided along with a platform (not shown) for being received by the mount 72 to support the enclosure 52 about the surface 55. The enclosure 52 may be supported by the stand and the platform when the stand is inserted into the mount 72. The enclosure 52, the stand, and the platform may be placed as close as possible against the surface 55 with the first transducer 54 being arranged to face directly into the surface 55.

The enclosure 52 includes a front end 81 and a rear end 83. In the event the cover 60 is coupled to the enclosure 52, the first transducer 54 is positioned within the enclosure 52 for facing directly from the rear end 83 into the cover 60 such that the first transducer 54 transmits the acoustic energy directly into the cover 60 (and subsequently to the surface 55). In the event the enclosure 52 is coupled to the surface 55, the first transducer 54 is positioned within the enclosure 52 and outwardly faces from the rear end 83 and into the surface 55 to transmit the acoustic energy directly into the surface 55.

Figure 3:
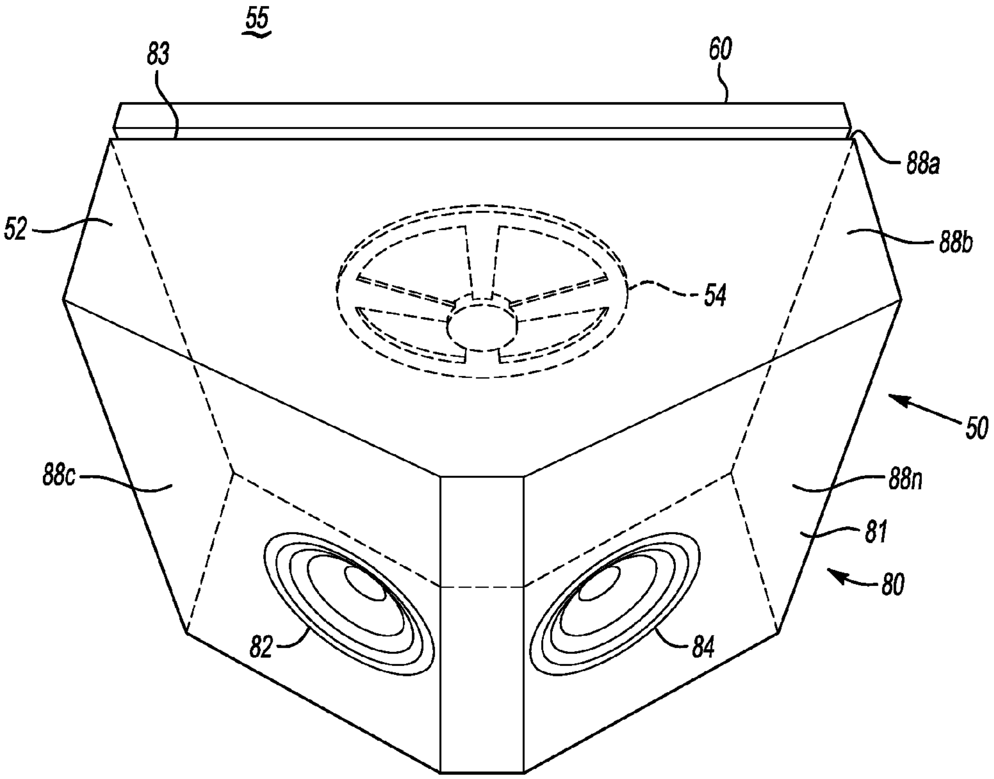
FIG. 3 depicts a rear side of the loudspeaker system in accordance to one embodiment.

FIG. 3 depicts the front end 81 of the enclosure 52 in accordance to one embodiment. The system 50 further includes a second transducer 82 and a third transducer 84. As shown, the second transducer 82 and the third transducer 84 are generally arranged within the enclosure 52 to transmit audio signals (or acoustic energy) in a direction that is generally opposite to the direction in which the first transducer 54 transmits the audio signal (or transmit the acoustic energy from the front end 81 of the enclosure 52). For example, the second transducer 82 and/or the third transducer 84 transmit the acoustic energy directly into the listening area 18, or away from the surface 55.

At least one of the second transducer 82 and the third transducer 84 may be arranged as a mid-ranger speaker for transmitting acoustic energy at an operating frequency of 250 Hz and 2 KHz. In this case, the first transducer 54 may then be a woofer that transmits acoustic energy at an operating frequency between approximately 20 Hz and 500 Hz. In another example, at least one of the second transducer 82 and/the third transducer 84 may be arranged as a tweeter that transmits the acoustic energy at an operating frequency between 2 KHz and 20 KHz. In this case, the first transducer 54 may be a mid-range speaker. It is recognized that second transducer 82 and the third transducer 84 may each be a mid-range speaker and a tweeter or a combination thereof.

As generally shown in FIGS. 2-3, the enclosure 52 includes a plurality of panels 88*a*-88*n*. Such panels 88*a*-88*n* of the enclosure 52 may support the first transducer 54, the second transducer 82 and the third transducer 84. For example, panel 88*a* may support the first transducer 54 such that the first transducer 54 is oriented to transmit the acoustic energy into the cover 60 (or into the surface 55) (see FIG. 1). Panel 88*c* may support the second transducer 82. Panel 88*n* may support the third transducer 84.

The panel 88*a* is positioned such that it extends parallel to the surface 55 to enable the first transducer 54 to transmit the acoustic energy directly into the surface 55. The panels 88*c* and 88*n* may be displaced at any angle from the surface 55 such that the second transducer 82 and the third transducer 84 generally face away from the surface 55 to enable the second transducer 82 and the third transducer 84 to transmit acoustic energy directly into the listening area 18. The second transducer 82 and the third transducer 84 may be arranged on the enclosure 52 (or panels 88*a*-88*n*) such that the second transducer 82 and the third transducer 84 are symmetric (or centered) with respect to one another as illustrated in FIG. 3.

Figure 4:
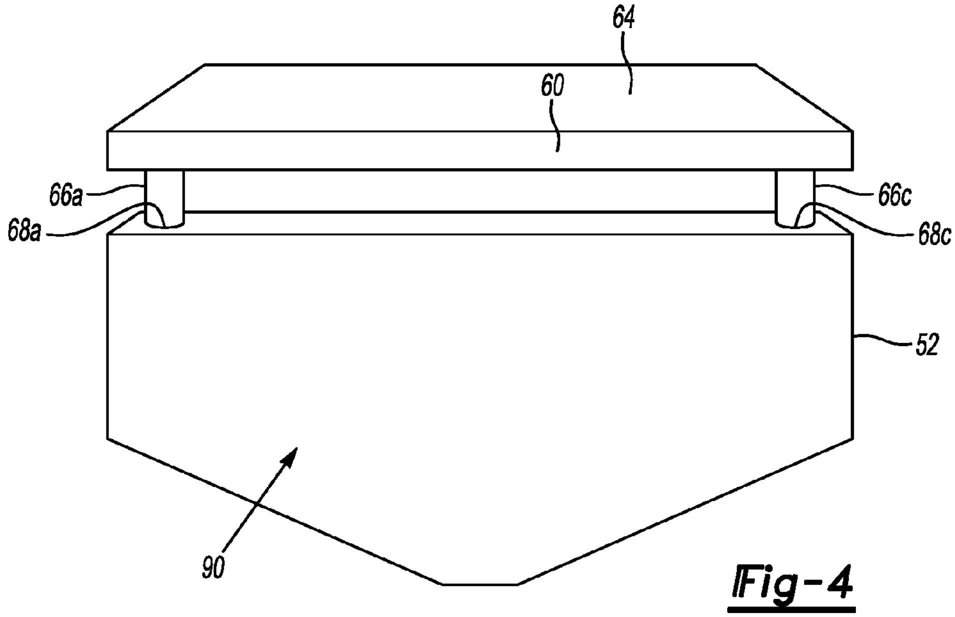
FIG. 4 depicts a bottom view of the loudspeaker system in accordance to one embodiment.

FIG. 4 depicts a bottom view 90 of the loudspeaker system 50 in accordance to one embodiment. As illustrated, the cover 60 is coupled to the enclosure 52. In this case, the first plurality of engagement devices 66*a*-66*n* is engaged with the second plurality of engagement devices 68*a*-68*n* for coupling the cover 60 to the enclosure 52.

Figure 5:
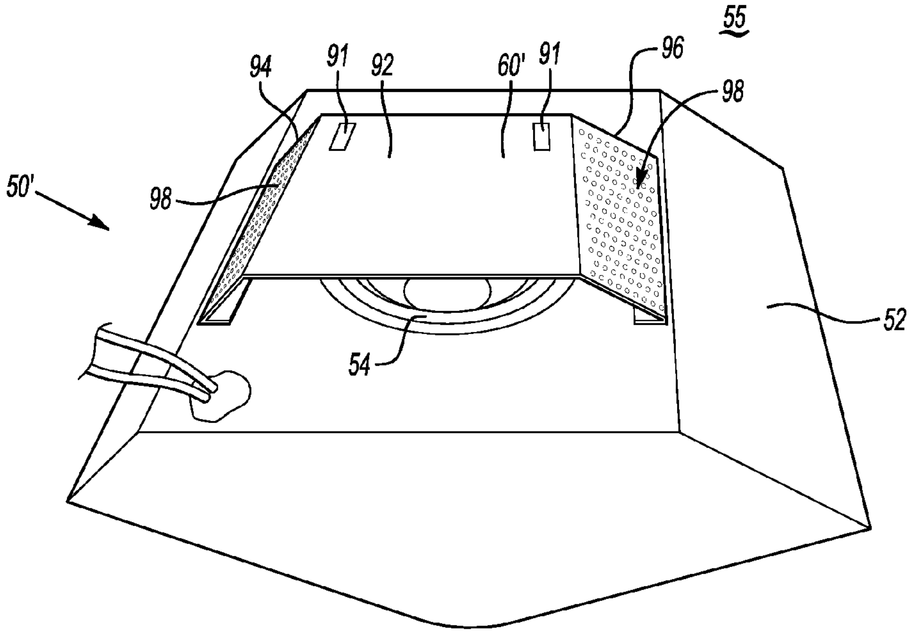
FIG. 5 depicts a perspective view of the loudspeaker system including a mountable cover in accordance to another embodiment.

FIG. 5 depicts a perspective view of a loudspeaker system 50' including a mountable cover 60' in accordance to another embodiment. The cover 60' couples the enclosure 52 to the surface 55. The cover 60' includes at least one first mounting device 91 for interfacing with an engagement device (not shown) on the surface 55. The enclosure 52 is mounted to the surface 55 for enabling the first transducer 54 to transmit the acoustic energy directly into the cover 60' (i.e., and into the wall or other vertical surface). The cover 60' made be made of steel, plastic, wood, etc.

The cover 60' may also include an engagement device 66 for being coupled to the enclosure 52. For example, the cover 60' may be welded or attached via adhesive to the enclosure 52 for supporting the same about the surface 55. The cover 60' includes a first section 92 that is spaced a distance from the first transducer 54. The distance between the first transducer 54 and the first section 92 (e.g., and the surface 55) may be within 0.5 and 1.5 inches. In general, the first section 92 is generally arranged to be at a distance from the first transducer 54 such that the first transducer 54 is placed at the proper distance away from the wall (or surface 55) to mitigate the frequency response dip.

The cover 60' further includes a second section 94 and a third section 96. The second section 94 and the third section 96 cooperate with the first section 92 for supporting the enclosure 52 about the surface 55. Each of the second section 94 and the third section 96 define a plurality of passageways 98 for enabling the acoustic energy to pass therethrough. In general, such passageways 98 enable the acoustic energy from the first transducer 54 to propagate around the enclosure 52.

Figure 6:
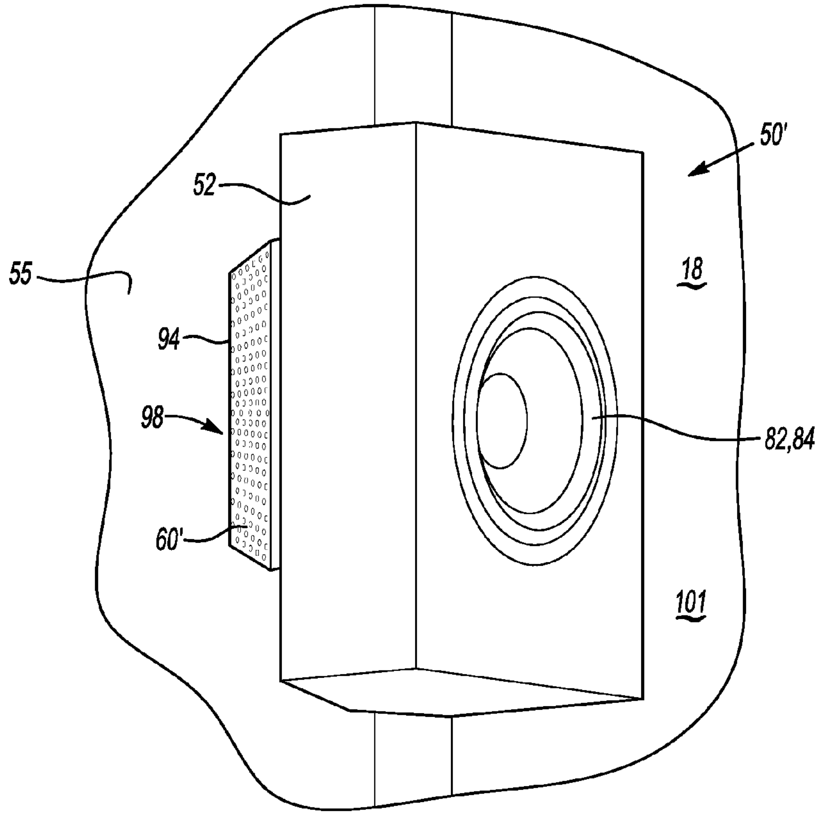
FIG. 6 depicts another perspective view of the loudspeaker system of FIG. 5 while mounted on a surface.

FIG. 6 depicts another perspective view of the loudspeaker system 50' of FIG. 5 while mounted on the surface 55. As shown, the loudspeaker system 50' is mounted on the surface 55 (e.g., wall). It is recognized that the surface may also be a door or any other vertical surface that is used to support a loudspeaker system. It is further recognized that the surface 55 may also include a horizontal or vertical surface such as a floor or ceiling of an establishment in the event a user intends to mount or arrange the loudspeaker system 50' in this manner. This may be applicable, for example, in concert settings when the loudspeaker system 50' is used as a monitor and positioned on the floor for transmitting audio signals to members performing the concert or for speakers arranged to output audio signals to an audience.

The loudspeaker system 50' further includes the second transducer 82 and/or the third transducer 84 as noted in connection with the loudspeaker system 50 of FIGS. 2-4. The loudspeaker system 50' may further include a filter 101 that may be positioned within or about the enclosure 52. The filter 101 may be an electrical filter and may be positioned within an amplifier or digital signal processor (not shown). Alternatively, the filter 101 may be formed of acoustic cavities as part of the enclosure 52 (or wall mounting apparatus). It is also recognized that the filter 101 may be used in connection with the loudspeaker system 50 of FIGS. 2-4. The relevance of the filter 101 will be discussed in more detail below.

Figure 7:
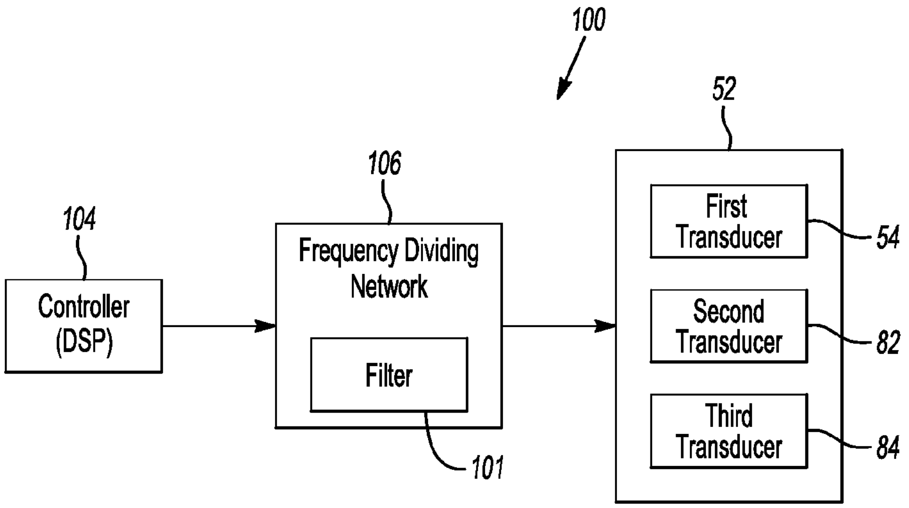
FIG. 7 depicts a block diagram for operating the loudspeaker system in accordance to one embodiment.

FIG. 7 depicts an apparatus 100 for operating the loudspeaker system 50, 50' in accordance to one embodiment. The apparatus 100 includes a controller (or digital signal processor (DSP)) 104, a frequency dividing network 106, and the enclosure 52. In general, the controller 104 is configured to transmit an audio signal at a corresponding frequency to the frequency dividing network 106. In one example, if the corresponding frequency of the audio signal is less than 2 KHz, then the frequency dividing network 106 enables the audio signal at this frequency to pass to the first transducer 54 if the first transducer 54 is arranged as a woofer.

The first transducer 54 may then output the audio signal at the frequency that is less than 2 KHz. As noted above, the first transducer 54 is arranged such that the audio signal is transmitted directly into the surface 55. For any audio signals received at the frequency dividing network 106 that are above 2 KHz, the frequency dividing network 106 then transitions the audio signal to the second transducer 82 and/or third transducer 84. In this case, the second transducer 82 and/or the third transducer 84 may be arranged as tweeters to transmit the audio signals above the frequency of 2 KHz.

As previously discussed, by arranging the first transducer 54 to output the acoustic energy directly into the surface 55, this condition may remove the frequency response dip for audio signals that are transmitted below a predetermined frequency. However, this condition may also result in a frequency response peak of typically between 700-1200 Hz with respect to the acoustic energy as output from the first transducer 54. The frequency response peak is generally caused due to the result of the interaction between the diaphragm 56 and a cavity (not shown) formed between the diaphragm 56, the enclosure 52, and the wall (and/or bracket). Such a peak manifests itself on both the on-axis and sound power of the loudspeaker system 50, 50' thereby enabling the removal thereof via appropriate filtering. In general, the on-axis response is the frequency response observed on a principle axis of radiation of a loudspeaker. The sound power of the loudspeaker is a weighted average of multiple frequency response measurements made at points on a spherical surface about the loudspeaker. The sound power indicates the total acoustical energy of the loudspeaker taking into account its spatial radiation characteristics.

The filter 101 is employed to remove such a frequency response peak. It is recognized that the filter 101 may be a passive filter that employs the use of coils, resistors, etc. or an active notch filter that is built into the controller 104 either using electrical circuitry or digital signal processing. The frequency dividing network 106 may be positioned within the enclosure 52 or may be positioned within the controller 104.

It is contemplated that a method for positioning the first transducer 54 may be provided such that first transducer 54 is positioned in the enclosure 52 for facing the cover 60 and/or surface 55 and for transmitting acoustic energy directly into the cover 60 and subsequently into the surface 55 or for transmitting the acoustic energy directly into the surface 55 to prevent a frequency response dip associated with the transmitted acoustic energy. In addition, a method for removing a frequency increase in response to the first transducer 54 transmitting the acoustic energy into the surface 55 may be provided as disclosed herein may also be provided.

Figure 8:
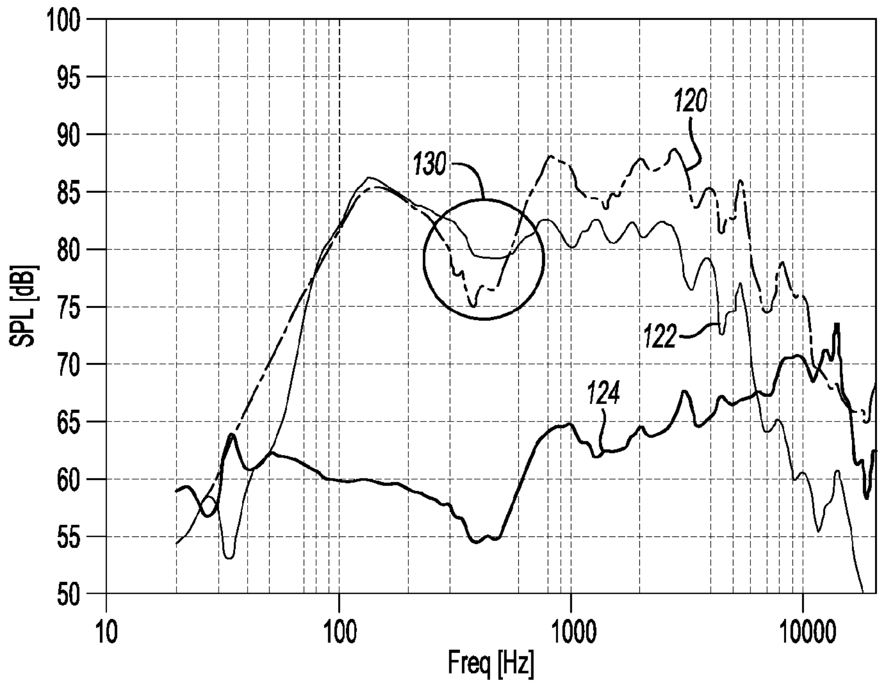
FIG. 8 depicts one example of a measured woofer response of a wall mounted surround loudspeaker.

FIG. 8 depicts one example of a measured woofer response of a conventional wall mounted surround loudspeaker (e.g., speaker transmits acoustic energy away from wall or other surface). In general, FIG. 8 depicts a conventional wall mounted surround configuration which exhibits a 10 dB response dip at 370 Hz. Waveform 120 is indicative of an on-axis frequency response (e.g., direct response). Waveform 122 is indicative of measured sound power in the conventional loudspeaker system. Waveform 122 is generally an average all of the energy that is transmitted from the audio signal in to the listening area 18 from all angles. Waveform 124 corresponds to a difference between the on-axis frequency response (e.g., waveform 122) and the measured sound power (e.g., waveform 124). As generally shown at 130, a large frequency response dip is exhibited with the conventional wall mounted surround loudspeaker.

Figure 9:
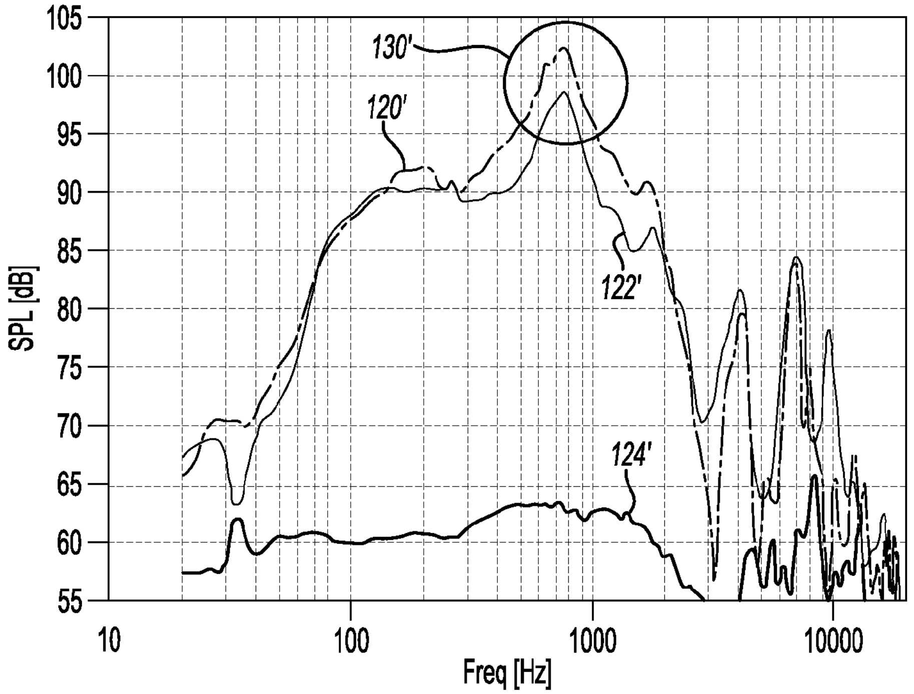
FIG. 9 depicts one example of a measured frequency response for the loudspeaker system in accordance to one embodiment.

FIG. 9 depicts one example of a measured frequency response for the loudspeaker system 50, 50' in accordance to one embodiment. FIG. 9 also depicts waveforms 120', 122', and 124'. Such waveforms 120', 122', and 124' generally represent the on-axis frequency response, the measured sound power and difference between the on-axis frequency response and the measured sound power for the loudspeaker system 50, 50', respectively. As generally shown at 130', a frequency response peak is exhibited when the first transducer 54 is arranged to transmit the acoustic energy towards the surface 55.

Figure 10:
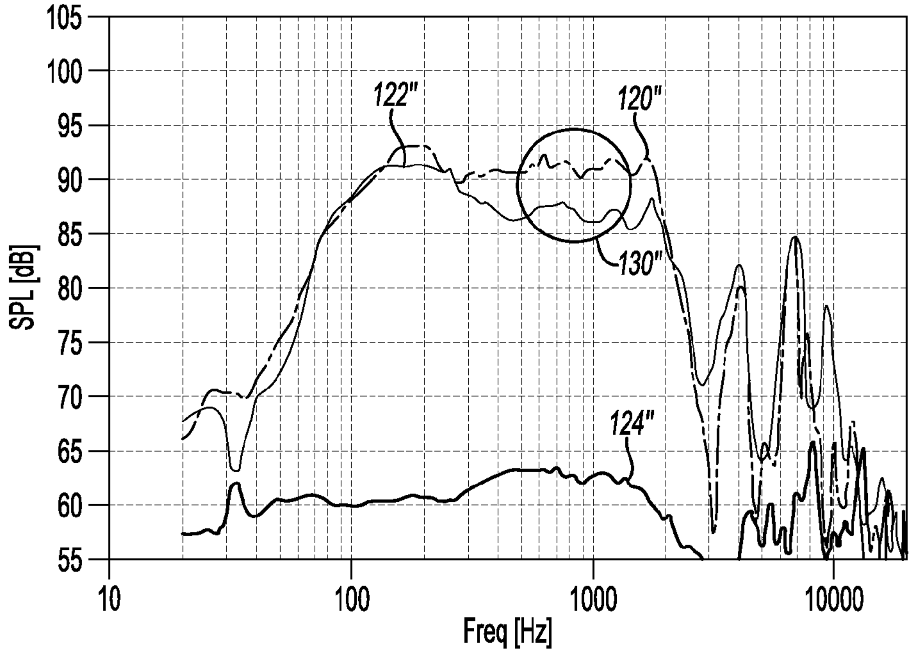
FIG. 10 depicts another example of a measured frequency response for the loudspeaker system including a filter in accordance to one embodiment.

FIG. 10 depicts another example of a measured frequency response for the loudspeaker system 50, 50' including the filter 101 in accordance to one embodiment. The waveforms 120", 122", and 124" generally represent the on-axis frequency response, the measured sound power and difference between the on-axis frequency response and the measured sound power for the loudspeaker system 50, 50', respectively, when the filter 101 is employed to filter the frequency response peak as exhibited in FIG. 9. As generally shown at 130", the frequency response is generally smooth which illustrates a canceling of the frequency peak. This condition illustrates a generally uniform dispersion of energy from the acoustic energy into the listening area 18, which further illustrates increased performance of the loudspeaker system 50, 50'.

While exemplary embodiments are described above, it is not intended that these embodiments describe all possible forms of the present disclosure. Rather, the words used in the specification are words of description rather than limitation, and it is understood that various changes may be made without departing from the spirit and scope of the present disclosure. Additionally, the features of various embodiments as set forth may be combined to form additional embodiment(s).

What is claimed is:

1. A speaker system comprising:

a speaker enclosure including:

a front end for facing a listening area;

a rear end for being mounted to a mounting surface;

a first transducer positioned within the speaker enclosure for facing into the mounting surface such that the first transducer transmits acoustic energy from the rear end towards the mounting surface to prevent a frequency response dip with the transmitted acoustic energy; and a cover for being mounted to the rear end of the speaker enclosure such that the first transducer faces the cover and the mounting surface, wherein the cover defines a plurality of passageways for enabling the acoustic energy to pass therethrough and generally towards the mounting surface such that the acoustic energy propagates around the speaker enclosure, and wherein the cover includes a thickness that is indicative of a predetermined distance to position the first transducer from the mounting surface to prevent the frequency response dip with the transmitted acoustic energy.

2. The speaker system of claim 1 wherein the cover includes a first plurality of engagement devices and the speaker enclosure includes a second plurality of engagement devices being positioned on the rear end for engaging the first plurality of engagement devices.

3. The speaker system of claim 1 wherein the cover includes a diffuser positioned on an inner side thereof for facing into the first transducer.

4. The speaker system of claim 1 wherein the first transducer is configured to transmit the acoustic energy at one of a first operating frequency range of between 20 Hz and 250 Hz and a second operating frequency range of between 250 Hz and 2 KHz.

5. The speaker system of claim 1 wherein the first transducer is generally positioned between 0.5 and 1.5 inches from the mounting surface.

6. The speaker system of claim 1 wherein the mounting surface comprises one of a wall, a ceiling, and a floor.

7. The speaker system of claim 1 wherein the speaker enclosure further includes at least one second transducer positioned within the speaker enclosure for facing into the listening area.

8. The speaker system of claim 7 wherein the first transducer is configured to transmit the acoustic energy at a first operating frequency into the mounting surface and the at least one second transducer is configured to transmit the acoustic energy into the listening area at a second operating frequency, the first operating frequency being different than the second operating frequency.

9. The speaker system of claim 1 further comprising a filter for removing a frequency peak associated with the first transducer transmitting the acoustic energy toward the mounting surface.

10. A speaker system comprising:

a speaker enclosure including:

a front end for facing a listening area;

a rear end for being mounted to a mounting surface;

a first transducer positioned within the speaker enclosure for directly facing into the mounting surface such that the first transducer transmits acoustic energy from the rear end directly into the mounting surface to prevent a frequency response dip with the transmitted acoustic energy; and a cover for being mounted to the rear end of the speaker enclosure such that the first transducer faces the cover and the mounting surface, wherein the cover defines a plurality of passageways for enabling the acoustic energy to pass therethrough and generally towards the mounting surface such that the acoustic energy propagates around the speaker enclosure, and wherein the cover includes a thickness that is indicative of a predetermined distance to position the first transducer from the mounting surface to prevent the frequency response dip with the transmitted acoustic energy.

11. The speaker system of claim 10 wherein the first transducer is configured to transmit the acoustic energy at one of a first operating frequency range of between 20 Hz and 250 Hz and a second operating frequency range of between 250 Hz and 2 KHz.

12. The speaker system of claim 10 wherein the first transducer is generally positioned between 0.5 and 1.5 inches from the mounting surface.

13. The speaker system of claim 10 wherein the mounting surface comprises one of a wall, a ceiling, and a floor.

14. The speaker system of claim 10 wherein the speaker enclosure further includes at least one second transducer positioned within the enclosure for facing into the listening area.

15. The speaker system of claim 14 wherein the first transducer is configured to transmit the acoustic energy at a first operating frequency into the mounting surface and the at least one second transducer is configured to transmit the acoustic energy into the listening area at a second operating frequency, the first operating frequency being different than the second operating frequency.

16. The speaker system of claim 10 comprising a filter for removing a frequency peak associated with the first transducer transmitting the acoustic energy into the mounting surface.

17. A speaker system comprising:

a speaker enclosure including:

a front end for facing a listening area;

a rear end for being mounted to a mounting surface;

a transducer positioned within the speaker enclosure for directly transmitting acoustic energy from the rear end into the mounting surface to prevent a frequency response dip with the transmitted acoustic energy; and a cover for being mounted to the rear end of the speaker enclosure such that the transducer faces the cover and the mounting surface, wherein the cover defines a plurality of passageways for enabling the acoustic energy to pass therethrough and generally towards the mounting surface such that the acoustic energy propagates around the speaker enclosure, and wherein the cover includes a thickness that is indicative of a predetermined distance to position the transducer from the mounting surface to prevent the frequency response dip with the transmitted acoustic energy.

* * * * *